United States Patent [19]
Lee et al.

[11] Patent Number: 6,051,283
[45] Date of Patent: Apr. 18, 2000

[54] MICROWAVE ANNEALING

[75] Inventors: Kam Leung Lee, Putnam Valley; David Andrew Lewis, Carmel; Ronnen Andrew Roy, Ossining; Raman Gobichettipalayam Viswanathan, Briarcliff Manor, all of N.Y.

[73] Assignee: International Business Machines Corp., Armonk, N.Y.

[21] Appl. No.: 09/005,729

[22] Filed: Jan. 13, 1998

[51] Int. Cl.[7] .............................. B05D 3/06; B05D 3/00; H01L 21/44

[52] U.S. Cl. .................. 427/553; 427/376.2; 427/376.6; 427/397.7; 427/419.7; 427/559; 427/569; 427/240; 427/248.1; 438/664; 438/683

[58] Field of Search .............................. 427/376.2, 376.6, 427/397.7, 383.3, 383.5, 383.7, 419.7, 553, 559, 240, 248.1, 569, 585; 438/655, 664, 682, 683

[56] References Cited

U.S. PATENT DOCUMENTS

| | | | |
|---|---|---|---|
| 4,063,973 | 12/1977 | Kirita et al. | 148/188 |
| 4,713,358 | 12/1987 | Bulat et al. | 437/65 |
| 4,918,051 | 4/1990 | Mantese et al. | 505/1 |
| 5,627,105 | 5/1997 | Delfino et al. | 438/627 |

OTHER PUBLICATIONS

J.M. Poate, et al., "Laser–Induced Reactions of Platinum and Other Metal Films With Silicon", Appl. Phys. Lett., 33:11, pp. 918–920 (1978).

T. Shibata, et al., "Metal Silicon Reactions Induced by CW Scanned Laser and Electron Beams", J. Electrochem. Soc.: Solid–State Science and Technology, 128:3, pp. 637–644 (1981).

G. Bomchil, et al., "Formation Kinetics of $MoSi_2$ Induced By CW Scanned Laser Beam", Appl. Phys Lett. 41:1, pp. 46–48 (1982).

I. Ursu, et al., "Titanium Silicide Synthesis as an Effect of CW $CO_2$–Laser Irradiation", J. Appl. Phys., 66:11, pp. 5635–5636 (1989).

*Primary Examiner*—Shrive Beck
*Assistant Examiner*—Michael Barr
*Attorney, Agent, or Firm*—Scully, Scott, Murphy & Presser

[57] ABSTRACT

The present invention is directed to a method of forming a new material layer or region near an interface region of two dissimilar materials, and an optional third layer, wherein at least one of said dissimilar materials or optional third is capable of being heated by microwave energy. The method of the present invention includes a step of irradiating a structure containing at least two dissimilar materials and an optional third layer under conditions effective to form the new material layer in the structure. An apparatus for conducting the microwave heating as well as the structures formed from the method are also described herein.

23 Claims, 11 Drawing Sheets

Rs Measurements

No reaction  Some reaction  CoSi  $CoSi_2$  Melt

XRD Samples

MICROWAVE ANNEALING

FIELD OF THE INVENTION

The present invention relates to a method of forming at least one new material layer or region within a structure which contains at least two dissimilar materials. More specifically, the method of the present invention relates to microwave heating a structure under conditions effective to form a new material layer or region within a structure, wherein said structure comprises at least two dissimilar materials having an interface region existing therebetween and, an optional third layer, wherein at least one of said dissimilar materials or optional third layer is capable of being heated by microwave radiation. The method of the present invention can be used in a wide variety of applications including, but not limited to: manufacturing of complementary-metal oxide (CMOS) semiconductor devices, tool bits and other structures wherein two dissimilar materials are employed.

BACKGROUND OF THE INVENTION

A key to continued CMOS miniaturization is the ability to scale down the horizontal and vertical dimensions of the semiconductor device while increasing speed, decreasing power, and operating at lower voltages. As devices are scaled below 0.25 $\mu$m, the sheet resistance and contact resistance of the transistor contacts must be maintained at low values. A further requirement is that the source-to-substrate leakage be maintained low in order to ensure device and circuit performance without error. These requirements put stringent boundary conditions on the nature and dimension of the gate and source/drain contacts, which are typically composed of metal silicides in microprocessors, ASICS and DRAM devices. In order to obtain low sheet resistance, the silicides must have resistivities below 100 $\mu$Ohm-cm and a thickness greater than 200 Å.

For self-aligned silicide processes, used ubiquitously for microprocessors and widely in DRAM technology, the silicide thickness must be minimized to avoid excessive consumption of silicon in the source/drain region. Excessive silicon consumption leads to silicide penetration of the junction and high leakage currents. This becomes more critical as the junction depth shrinks with devices having a channel length below 0.25 $\mu$m. In addition, in order to maintain abrupt and shallow p-/n-junctions in scaled CMOS devices, the thermal annealing, which follows junction formation, must be reduced to minimize dopant motion in the junction.

In order to meet the above conflicting requirements, source/drain silicide materials having a balance of low resistivity and moderate silicon consumption are being used. Such material include Ti silicides, Co silicides and Ni silicides. Additionally, the trend in silicide formation, as with junction formation, is toward utilizing annealing processes which have shorter times and high temperatures and that use lamp-based thermal annealing wherein the silicide formation is accomplished in 10–60 seconds. This minimizes side reactions, such as oxidation, inversion of silicide where polysilicon may move to the top surface of the silicide, and breaking up silicide film into islands or agglomerates, that are generally associated with increased sheet resistance and junction leakage. However, even rapid thermal annealing (RTA) can lead to agglomeration and increased resistance. This restricts the thermal process window for the reaction of the metal films to form low resistance contacts before the films become unstable. The tendency to agglomerate also increases as the transistor line width shrinks, further narrowing the process window for low resistance and low leakage contacts.

Evolution of silicide processing began in the late 1970's when silicides were introduced into wide spread use in large-scaled integrated (LSI) devices. Silicide formation was obtained by annealing at high temperatures for minutes or, in some cases, for hours in a furnace containing a flowing gas. More recently, RTA processes have been employed. In RTA only the silicon wafer is substantially heated and for periods not exceeding 1–2 minutes. The wafer is rapidly ramped up to a hold temperature (typically greater than 30° C./sec) and, thereafter, rapidly cooled.

There are several examples in the prior art of silicide formation on silicon wafers utilizing very rapid thermal annealing (<1 sec). These examples include the use of laser annealing and electron beam annealing. The laser beam examples are further subdivided between excimer, Q-switched YAG, and Continuous Wave (CW) annealing. One of the earliest reports from Poate, et al., "Laser-induced reactions of platinum and other metal films with silicon", Appl. Phys. Lett. 33, (1978) p. 918, indicated formation of silicide in the 100 ns time scale by heating with a Nd—YAG laser and causing the metal/silicon mixture to melt and recrystallize into silicides under beam diameters of about 10 microns. Other studies involving excimer annealing using 30 ns pulse also melted the silicon substrate to form the silicide.

Numerous studies using CW annealing in the 100 microsecond time regime have shown silicide formation by solid state diffusion. Some examples of such studies include: T. Shibata, et al. "Metal Silicon Reactions Induced by CW Scanned Laser and Electron Beams", Electrochem. Soc.: SOLID-STATE SCIENCE AND TECHNOLOGY, 128, No. 3 (1981) p. 637; G. Bomchili, et al., "Formation Kinetics of MoSi$_2$ induced by CW Scanned Laser Beam", Appl. Phys. Lett., 41 (1982), p. 46; and I. Ursu, et al., "Titanium Silicide Synthesis as an effect of CW CO$_2$ Laser Irradiation", J. Appl. Phy., 66 (1989), p. 5635. Silicide formation using electron beam irradiation has also been reported by T. Shibita, et al., ibid.

All of the above annealing techniques employ small diameter beams ranging from tens of microns (CW laser) to a millimeter (excimer laser). Annealing over macroscopically large areas require beam rastering.

Despite the current state of the art, there is a continued need to develop new and improved silicide processes which do not have any of the problems mentioned with the prior art processes.

SUMMARY OF THE INVENTION

One object of the present invention is to provide a method of forming a new material layer or region within a structure having at least two dissimilar materials. This new material layer or region is composed of components from the two dissimilar materials and is formed by irradiating the structure with microwave energy.

Another object of the present invention is to provide a method of producing a solid state layer or region within a structure that does not exhibit any side reactions such as film agglomeration or inversion.

These as well as other objects are achieved by the present invention by using microwave heating in a manner such that the power, time and pulsing of the microwave process is controlled so as to form a new material layer or region at or near the interface region of two dissimilar materials, wherein one of said dissimilar materials is capable of being heated by radiation in the microwave range. The method of the present invention thus comprises the steps of:

(a) providing a structure having at least two dissimilar materials intimately in contact with each other so that an interface region exists therebetween, and an optional third layer, wherein at least one of said dissimilar materials or said optional third layer is capable of being heated by microwave radiation; and (b) irradiating the structure with microwave energy under conditions effective to form a new material layer or region in proximity to said interface region of said structure.

Broadly speaking then the method of the present invention comprises a procedure wherein two dissimilar layers of a structure are altered to produce one or more new material layers or regions near the original interface of the two dissimilar materials. This may apply to the reaction of WC on steel to form an adhesive layer between the hard coating (WC) and the substrate (steel) such as is desired in tool bit coating technology.

In addition, the method of the present invention may find applications in a structure containing multilayers, e.g., CMOS semiconductor devices, such that the reaction caused by microwave heating forms a new material layer therein. By controlling the microwave energy, frequency, layer thickness and layer materials, it is possible to promote the formation of various new material layers or regions within multilayer structures. The new material layer or region may exist as a solid state material, a crystalline phase, an amorphous phase or a group of phases.

It is also possible to use the method of the present invention to provide a localized pattern to the structure. The advantage over conventional heating may be in localizing the reaction at a certain depth, or by short pulse durations where unwanted side reactions can be minimized.

Another aspect of the present invention relates to an apparatus for forming a new material layer or region in a structure which comprises at least two dissimilar materials, and an optional third layer, wherein at least one of the dissimilar materials or optional third layer is capable of being heated by microwave energy. Specifically, the method of the present invention comprises a means for supporting said structure and a means for supplying microwave radiation in the form of a flat beam for uniform exposure of the structure to microwave radiation.

A further aspect of the present invention relates to structures which are formed by the method of the present invention. Specifically, the structure formed in the present invention comprises at least two dissimilar materials in intimate contact with each other so as to form an interface region, and a continuous new material layer or region formed in proximity to said interface region, wherein the new material layer or region comprises a reaction product of the two dissimilar materials. For example, when one of the dissimilar materials is a metal and the other dissimilar material is Si, a metal silicide layer or region is present in the structure.

DETAILED DESCRIPTION OF THE INVENTION

The present invention which provides a method of forming a new material layer or region at or near the interface region of at least two dissimilar materials will now be described in greater detail by referring to the accompanying drawings wherein like reference numerals are used for like and corresponding elements of the drawings. It is noted that in the method of the present invention at least one of the dissimilar materials or an optional third layer must be capable of being heated by radiation that is in the microwave range. By "microwave range" it is meant electromagnetic energy that has a frequency of from about $4 \times 10^{11}$ to about $3 \times 10^8$ Hertz. In the microwave range, the heating is typically caused by rotation of molecules, but if either of the materials are metallic in nature eddy currents are formed within the conductive material at a similar frequency to the impinging radiation and ohmic heating results.

Figure 1A:
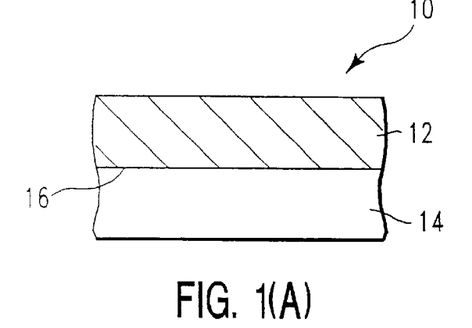
FIGS. 1(A)–(D) are cross-sectional views of basic structures that can be employed in the present invention prior to irradiation with microwave energy.

Referring first to FIG. 1(A), there is shown a structure 10 that contains a layer of first dissimilar material 12 on the surface of a second dissimilar material 14 whereby an interface 16 between the first dissimilar material 12 and second dissimilar material 14 exists. In accordance with this embodiment of the present invention, at least one of said dissimilar materials must be capable of being heated by radiation in the microwave range.

The types of materials that can be used as first dissimilar material layer 12 may vary depending upon the particular application. Suitable materials that can be employed as the first dissimilar material include, but are not limited to: silicon-containing materials; transition metals and non-transition metals; alloys of said transition metals and/or non-transition metals; polymers such as polyolefins, e.g. polypropylene and polyethylene, epoxy resins, polyesters and nylon; insulators such as $SiO_2$, $Si_3N_4$ and diamond-like carbon; ceramic oxides, nitrides or carbides; doped or undoped glass; monomers, e.g. ethylene and propylene; and the like. When the present invention is used in applications involving CMOS devices, it is highly preferred that first dissimilar material be composed of a transition metal selected from Group IVB, VB, VIB, VIII and IB of the Periodic Table of Elements (CAS version). Suitable metals that can compose first dissimilar material include, but are not limited to: titanium, tantalum, tungsten, cobalt, palladium, nickel, platinum, niobium, zirconium, molybdenum, iridium, vanadium, yttrium and the like. Mixture or alloys of these metals are also contemplated herein. In a highly preferred embodiment of the present invention, wherein CMOS devices are being manufactured, the first dissimilar material is a layer composed of cobalt, titanium, platinum, nickel or their alloys.

The dissimilar material that makes-up second dissimilar material layer 14 may also vary depending upon the type of product being produced. Examples of suitable materials used in layer 14 include, but are not limited to: semiconductor materials composed of silicon-containing materials; doped or undoped glass; transition or non-transition metals, alloys of transitions metals; alloys of non-transition metals; alloys of transitional and non-transitional metals; polymers, such as polyolefins, epoxy resins, polyesters and nylon; monomers; insulators; ceramic oxides, nitrides or carbides; and the like. It is noted that the materials used in forming layers 12 and 14 are not like materials. Instead, layers 12 and 14 are composed of different materials.

When used in CMOS device fabrication, layer 14 typically is a semiconductor material that contains silicon. Suitable silicon-containing materials that can be employed in the present invention as second dissimilar material layer 14 include, but are not limited to: silicon, SiGe, SiGeC and SiC. Of these materials, it is highly preferred that second material layer 14 be composed of silicon.

When a silicon-containing material is employed in the present invention, it is generally in the form of a wafer that is prepared utilizing techniques well known to those skilled in the art. This includes growing of the silicon-containing wafer from a single crystal and the like.

The wafers can be doped or undoped depending on the type of device being manufactured. When doped, p-type or n-type dopants may be employed. An example of a p-type dopant that can be employed in the present invention is boron whereas As and P can be used as the n-type dopant. Other dopants that can be employed in the present invention include: Sb, Sn, Ga and N.

As stated above, first dissimilar material layer 12 is formed on the surface of second dissimilar material layer 14 so that interface 16 exists between the first dissimilar material and the second dissimilar material. Specifically, the structure shown in FIG. 1(A) is formed by depositing the first dissimilar material to one surface of second dissimilar material by utilizing deposition techniques well known to those skilled in the art. For example, deposition of the first dissimilar material may be carried out using chemical vapor deposition, physical vapor deposition, plasma deposition, spin-coating and electro- or electroless plating. The exact conditions employed in these deposition techniques may vary depending upon the specific technique chosen.

The thickness of the first dissimilar material layer may vary depending on the end use of the final product but for semiconductor applications, first dissimilar material layer 12 has a thickness of from about 10 to about 10,000 Å. More preferably for CMOS devices, the deposition step provides a layer of said first dissimilar material having a thickness of from about 10 to about 1000 Å on the surface of said second dissimilar material.

Figure 1B:
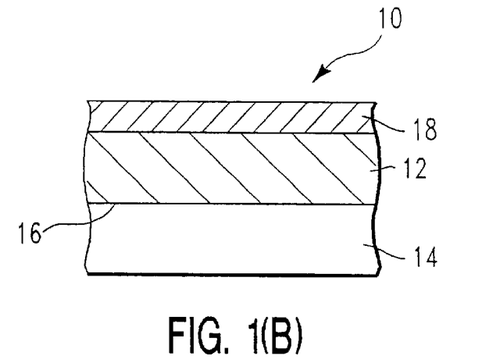

An alternative structure that can also be employed in the present invention is shown in FIG. 1(B). In accordance with this embodiment of the present invention, the structure contains, in addition to layer 12 and 14, a third layer 18. The third layer employed in the present invention is typically composed of a microwave absorbing material and it is of variable thickness. Suitable microwave absorbers that can be employed herein include, but not limited to: metallic materials including elemental metals such as Cu, Ni, Cr and W, and compounds containing at least one metallic element such as CoN, $Al_3N_4$, or TiN; carbon-filled ceramics, glasses and polymers; doped $SiO_2$, amorphous silica, doped glass and the like.

Figure 1C:
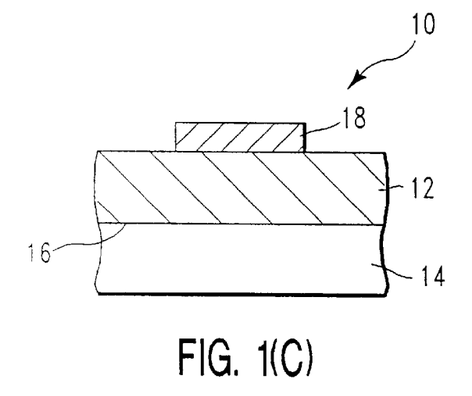

The structure shown in FIG. 1(B), can be used to provide a localized pattern in the structure. Specifically, the localized pattern can be formed by first patterning layer 18 utilizing conventional techniques well known to those skilled in the art. This provide a patterned structure as shown in FIG. 1(C). This patterned structure can then be subjected to microwave heating as described hereinbelow to form a discrete region of a new material in the structure. The final structure that results from microwave heating the structure of FIG. 1(C) is shown in FIG. 1(E). As can be seen therein, the method of the present invention can be used to form discrete regions of new material 24 in a structure.

In addition to these structures shown in FIGS. 1(A)–(C), the present invention also contemplates the use of multilayer structures containing at least two dissimilar material layers and any number of additional layers. The additional layers in the multilayer structure can include the first dissimilar material, the second dissimilar material and the third material layer 18.

Figure 1D:
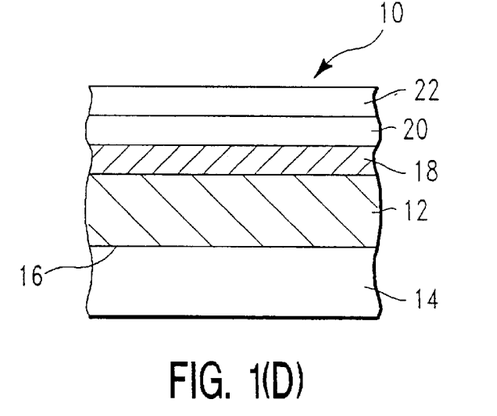
Figure 1E:
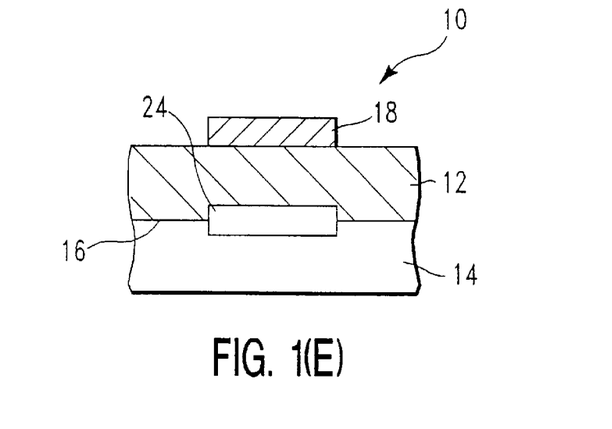
FIG. 1(E) shows the cross-sectional view of the structure of FIG. 1(C) after irradiating with microwave energy.

A multilayer structure containing 5 layers is shown in FIG. 1(D). In this figure, reference numerals 12, 14, 16 and 18 have the same meanings as defined hereinabove. Layers 20 and 22, on the other, may be composed of any kind of material depending upon the device being manufactured. This includes metallic layers, insulating layers, microwave absorbing layers and the like. Layers 20 and 22 may also be composed of any of the materials used in forming layers 12, 14 and 18.

It should be emphasized herein that materials that make-up the structures of the present invention may or may not be chemically bonded to each other either before or after the microwave heating step. Instead, they may be physically bonded only. When the structure contains layers that are not chemically bonded, the method of the present invention can be used to provide an adhesive layer between the at least two dissimilar materials. The other layers present on the surface of a multilayer can be removed since no chemical bond is formed therebetween. Thus, the present invention can be used in stack applications to provide a thinner structure wherein an adhesive layer bonds at least two dissimilar materials.

In accordance with the present invention, the desired structure containing two dissimilar materials such as shown in FIGS. 1(A)–(D) is then irradiated with microwave radiation under conditions effective to form a new material layer or region in the structure. Specifically, the structure is irradiated with microwave radiation having a frequency of from about 300 megahertz to about 400 gigahertz, a pulse duration of from about 0.02 to about 20 seconds, and a power density of least about 100 watts/$cm^2$. More preferably, the irradiating step is carried out with microwave radiation having a frequency of from about 80 to about 120 gigahertz, a pulse duration of from about 0.02 to about 0.15 seconds, and a power density of from about 500 to about 20,000 watts/$cm^2$. Single or multiple pulses of microwave radiation can be employed in the present invention. Using the above defined conditions a continuous material layer or region is formed in proximity of the interface that exists between the two dissimilar materials. This new material layer or region is the reaction product formed when the two dissimilar materials are subjected to heating caused by microwave absorption of one of said dissimilar materials or the optional third layer.

It is noted that the method of the present invention may consume one dissimilar material entirely, consume both dissimilar materials partially or consumed both fully to form a structure containing only the reaction product of the two dissimilar materials.

In the present invention, the irradiation causes heating of the structure. Although it is difficult to measure the exact temperature caused by the microwave heating step, it can be estimated to be of from about 500° to about 1400° C. for a pulse duration of 30–100 mS.

During the irradiation step, the conditions are such that heating occurs in the vicinity of the interface between the two dissimilar materials and, more importantly, the conditions are effective to cause the formation of a new material layer or region existing between the two dissimilar materials of the desired structure. That is, the conditions are effective to form an interaction between the first dissimilar material and the second dissimilar material which forms a new material layer or region comprising components from the first and second dissimilar materials. For example, when the first dissimilar material is a metal and the second dissimilar material is a silicon-containing compound, a metal silicide such as titanium silicide, cobalt silicide and tungsten silicide may form. Typically, in the present invention, the new material layer is formed between the first and second dissimilar layers at a depth of from about 20 to about $10^8$ Å. More preferably, the new material layer could be formed at a depth of from about 20 to about 20,000 Å.

As stated above, the present invention uses microwave energy to heat a first dissimilar material, e.g. a metal layer, deposited on the surface of a second dissimilar material, e.g. silicon-containing material, under conditions effective to form a fully reacted solid state, e.g. metal silicide, layer residing at the interface between said dissimilar materials. An important result of the method of the present invention is that the solid state layer does not exhibit any agglomeration or inversion even when heated well above the temperature to complete the reaction, as determined by electrical resistance, Rs, measurements.

Another aspect of the present invention relates to an apparatus for forming a new material layer or region in a multilayer structure containing at least a first dissimilar material, a second dissimilar material, and an optional third layer, wherein at least one of said first and second dissimilar materials or said optional third layer is capable of being heated by microwave radiation. Specifically, the apparatus of the present invention comprises a means for supporting said structure, a means for supplying microwave radiation in the form of a Gaussian beam, and a means for converting said Gaussian beam into a flat beam for uniform exposure of microwave radiation across said structure.

In one embodiment of the present invention, the supporting means includes a holder, the microwave energy supplying means is a gyratron apparatus operating at 109 GHz, and said means for converting includes a system of highly polished and shaped mirrors for carrying out said conversion.

Another aspect of the present invention relates to structures that are formed by utilizing the method and apparatus of the present invention. In accordance with this aspect of the present invention, the structure of the present invention comprises at least two dissimilar materials in intimate contact with each other so as to form an interface region, and a continuous new material layer or region formed in proximity to said interface region. As stated above, the new material layer or region comprises a reaction product that is formed between the two dissimilar materials upon heating with microwave energy. Thus, when one of the dissimilar materials is a metal and the other is Si, the new material layer or region would be composed of a metal silicide.

The following example is given to illustrate the scope of the present invention. Because this example is given for illustrative purposes only, the invention embodied therein should not be limited thereto.

EXAMPLE

This example demonstrates the method of the present invention as well as the advantages that can be obtained by utilizing the same. Specifically, 5 inch silicon wafers were coated with either Co or Ti metal in blanket films, with half of each Co wafer subjected to a second 20 nm layer of TiN sputtered on top of the metal layer. In addition, two different thicknesses of Ti and Co were produced on separate halves of each wafer, such that every Co wafer has four quadrants containing a unique combination of metal thickness and TiN coating, while each Ti wafer had two halves of varying Ti thickness.

These layers were then subjected to a microwave beam having a preset power of from 270 to 350 kW focused with the use of mirrors to areas nominally about 2 to 3 inches in diameter. The power density in the central beam is estimated to be about 10 kW/cm².

Separate wafers were subjected to different microwave pulse duration up to 100 mS; in some experiments the same wafers were subjected to multiple pulses of the same or varying duration, with approximately 1 minute between pulses to allow cooling of the wafer to ambient temperature. The beam was centered on each wafer so that all quadrants would get some exposure to the direct beam. After removal from the microwave chamber, the wafers were inspected visually, the resistance was measured by a four-point probe, and X-ray diffraction and Rutherford Backscattering spectrometry (RBS) were performed on selected samples. For samples exposed under a 2 inch beam, resistance changes were observable after 35 mS pulse duration, indicating the beginning of metal-silicon interaction.

Figure 2:
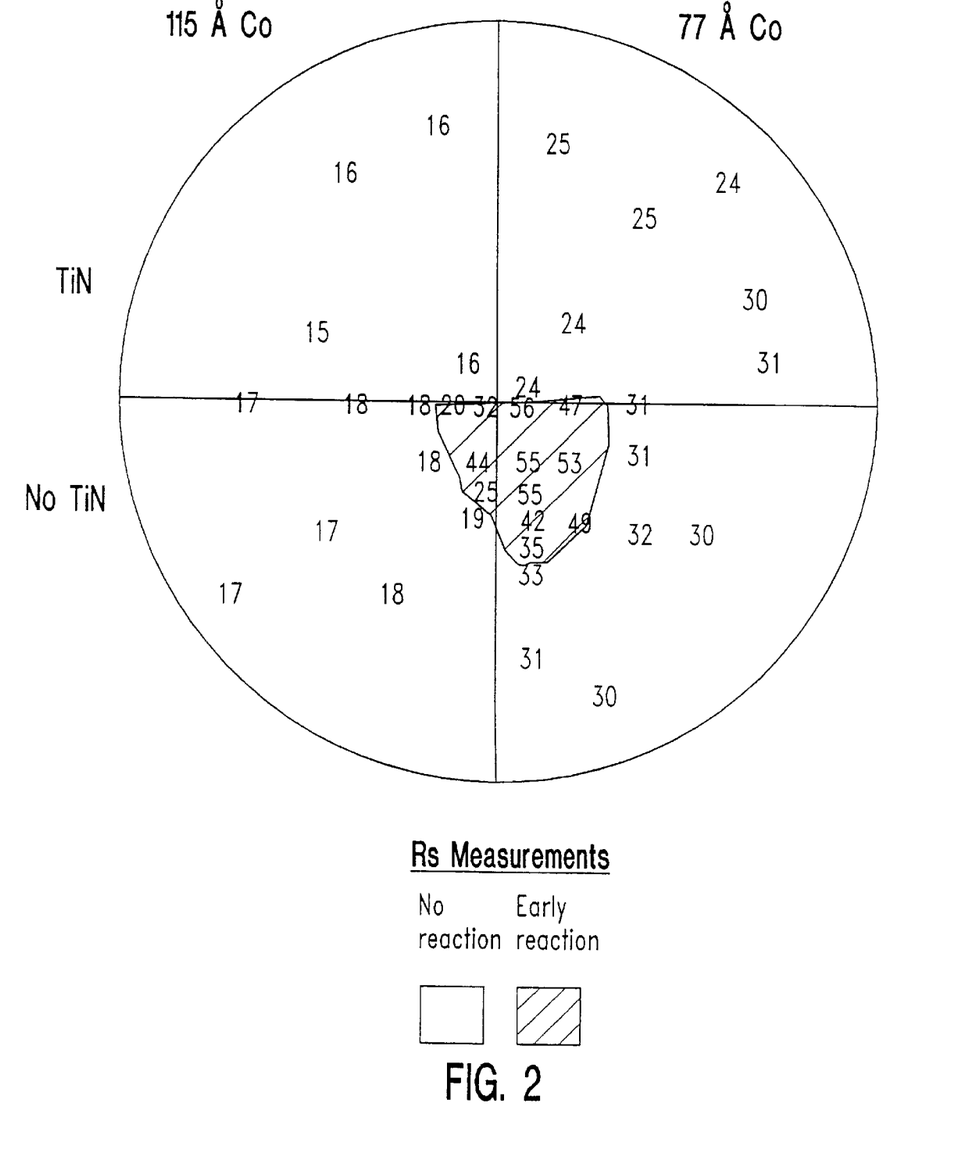
FIG. 2 is a map showing the resistance as a function of position on a wafer of Example 1 where 90 Å Co is deposited on Si.

FIG. 2 shows a map of resistance as a function of position on the wafer for one such case where 90 Å Co was deposited on Si. The outer portion of each quadrant has a uniform and low resistance value, but varying between quadrants, corresponding to differences in thickness of the deposited Co and TiN. The inner portion of the wafer shows a marked increase in resistance indicating the interaction of Co with the Si substrate, which produces a large increase in resistance as CoSi is formed. For the values of Co thickness employed, one expects a resistance of between about 100 to about 200 Ohm/Sq. When CoSi is fully formed in the absence of a TiN capping layer (see, FIG. 3). The intermediate values obtained at 35 mS indicate that the reaction of Co and Si is not advanced to the CoSi stage, but suggests that the wafer temperature reached the 300°–400° C. range at a minimum. The contour drawn around the inner areas suggests the boundary of the measurably reacted wafer portion. FIG. 4 shows the regions wherein the applied beam is most intense and most weak.

Specifically, FIG. 4 shows that the applied beam is most intense in the middle portion of the wafer and less intense at the edges. This figure also shows that the beam pulse must be at least 100 mS before any measurable reaction may take place.

Figure 5:
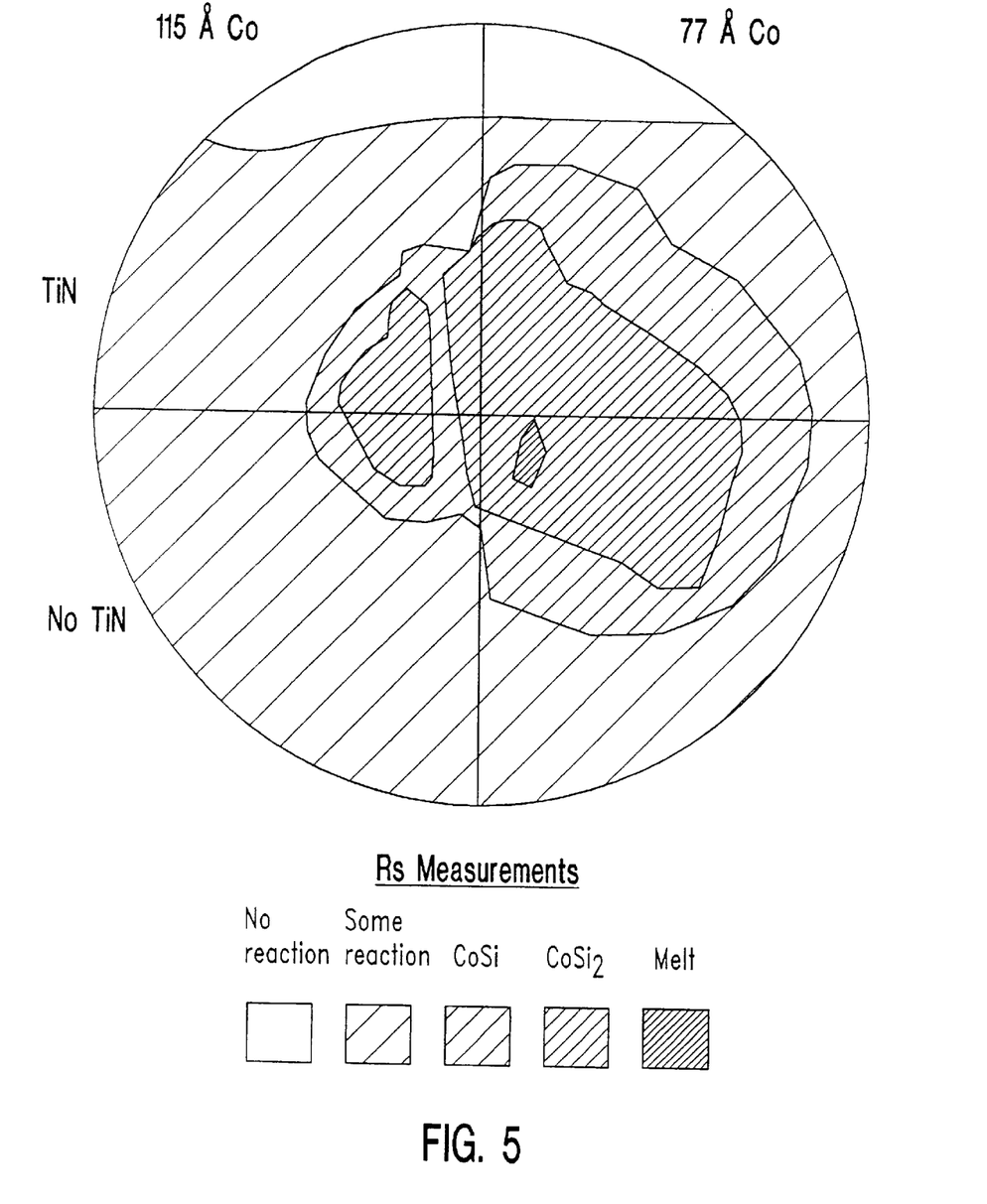
FIG. 5 shows an resistance map after a single 100 mS pulse, together with a map regions assigned to a different Co—Si phases.

FIG. 5 shows a resistance map taken after a single 100 mS pulse. Near the wafer center is a large area which exhibits low Rs values of about 10 Ohm/Sq. or less surrounded by a narrow region where Rs is very high, in the range of 100–200 Ohm/Sq. For the uncoated Co half, the outside of the wafers is of an intermediate value of about 25–50 Ohm/Sq.

Figure 3:
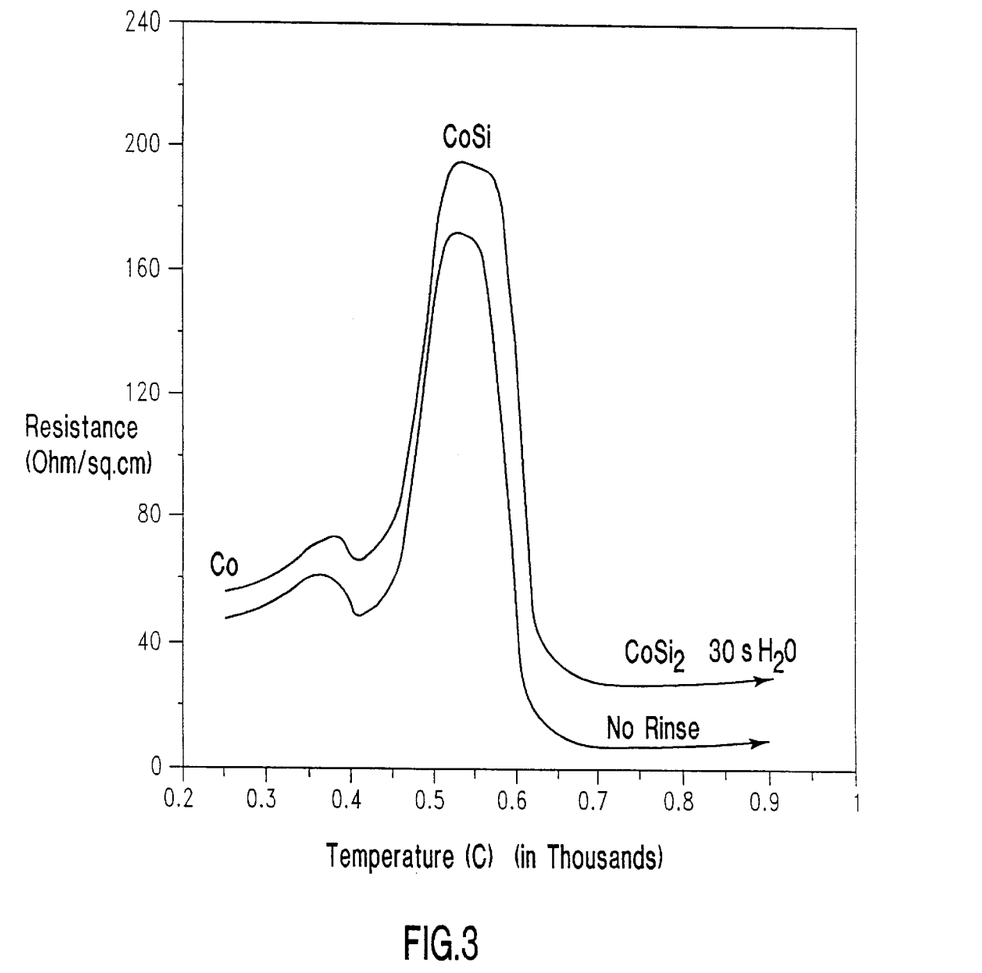
FIG. 3 is a graph illustrating resistance vs. temperature of a wafer containing 90 Å Co deposited on Si.
Figure 4:
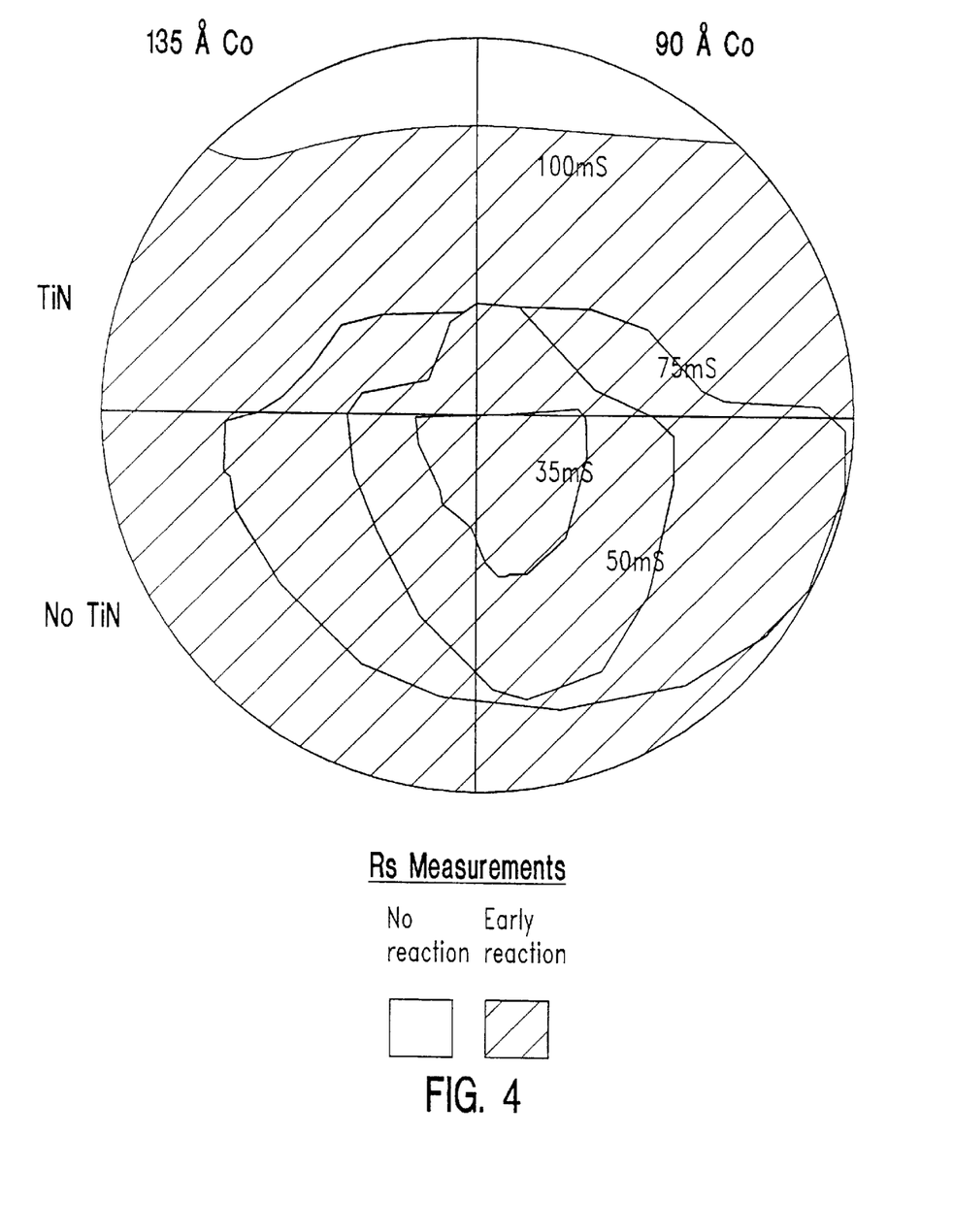
FIG. 4 shows the boundary of measurably reacted wafer portion as a function of pulse time.

This data can be better understood by referring to the curve Rs vs. temperature during $CoSi_2$ formation shown in FIG. 3. The outer portion of the wafer represents the initial stage of silicide reaction where Rs increases and is a maximum when CoSi forms, at slightly higher temperature, which is seen in the intermediate region of the wafer. Enclosed in the center is the portion of the wafer which shows $CoSi_2$ formation as evidenced by the very low Rs values. The boundaries of the $CoSi_2$, CoSi and reacted areas are sketched based on this known correlation of Rs, temperature and phase in Co silicide formation process.

Figure 6A:
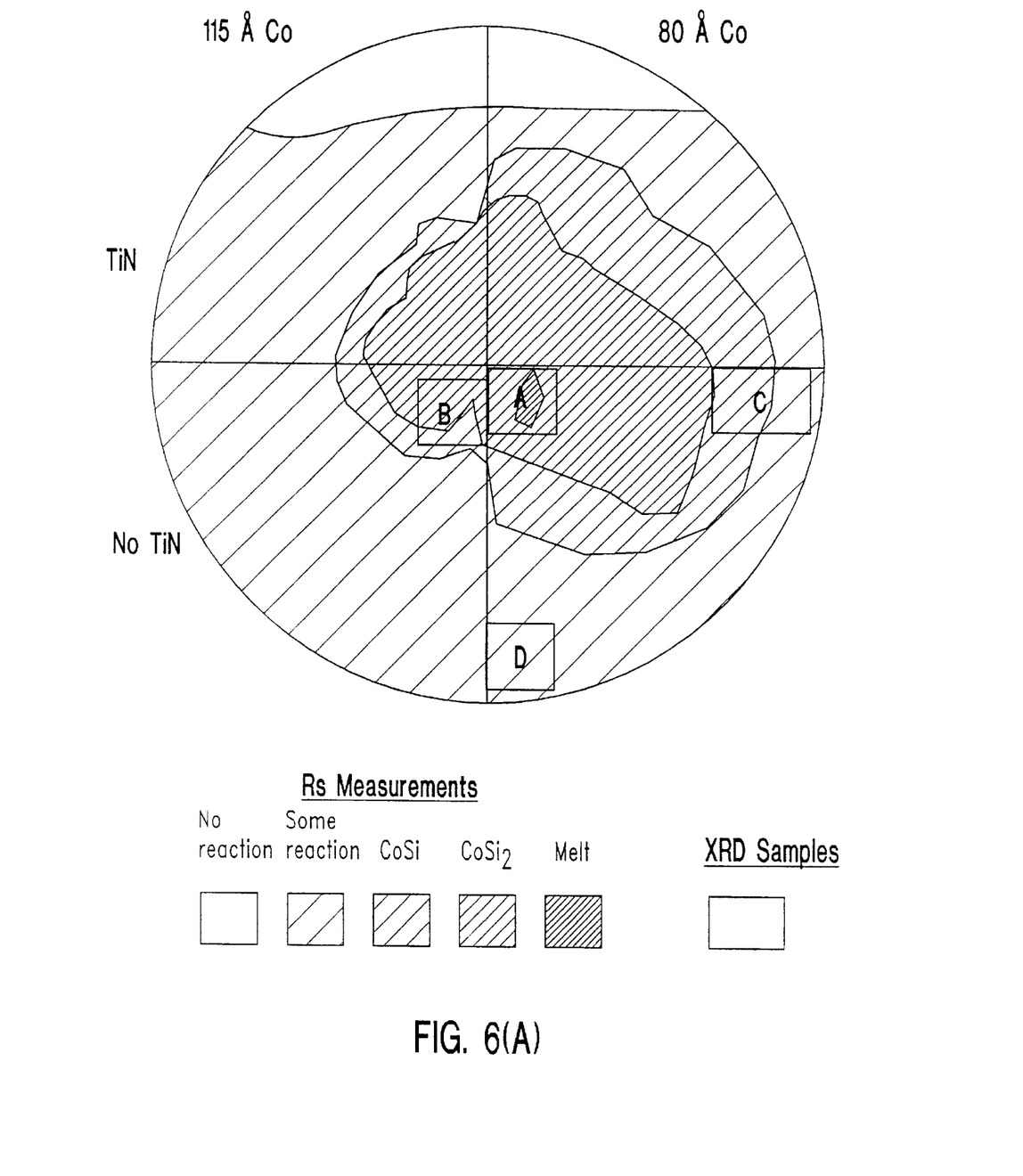
FIG. 6(A) shows the areal distribution of phases based on FIG. 5 resistance data.
Figure 6B:
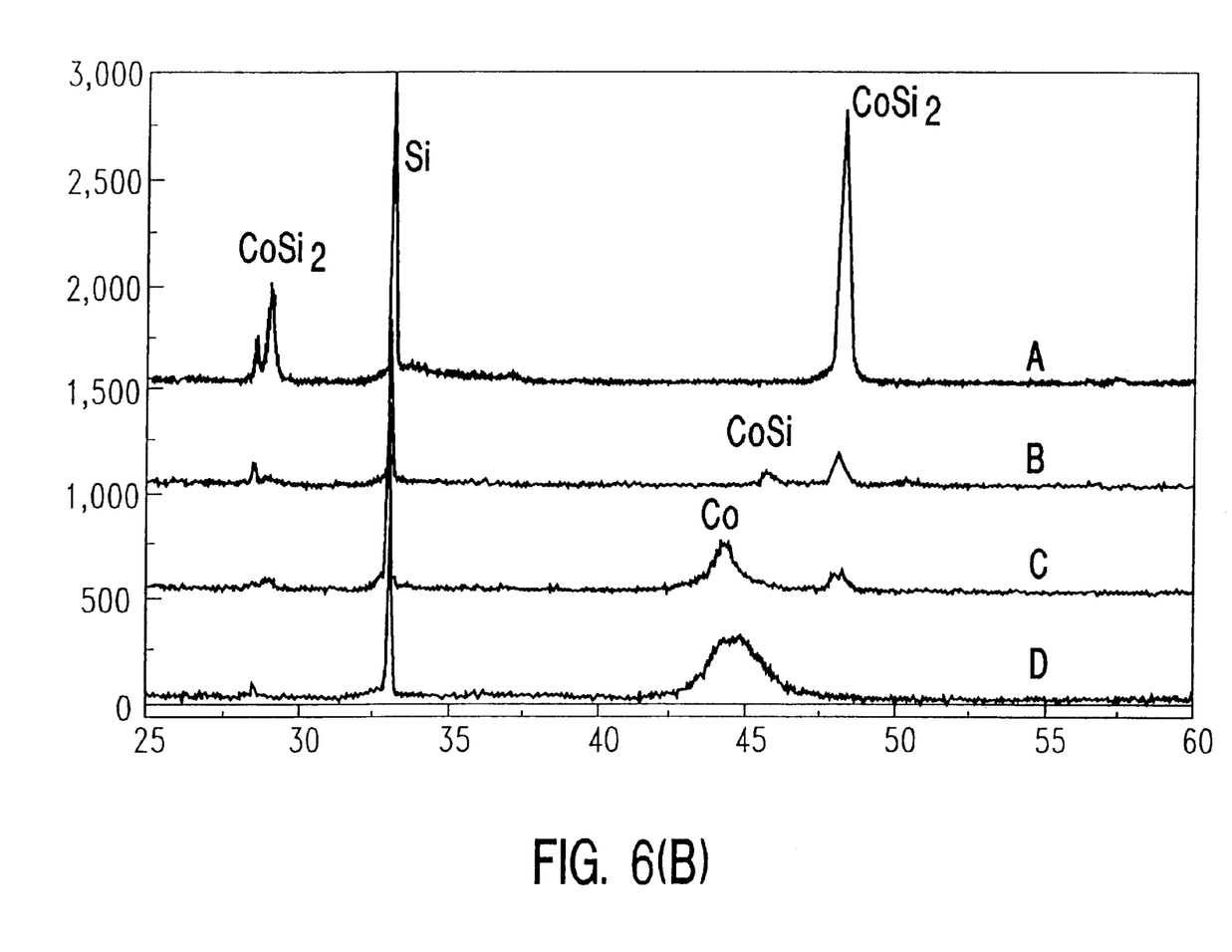
FIG. 6(B) shows the X-ray diffraction data after 100 mS irradiation, confirming the phase formation assignment in FIG. 6(A).

Pieces of the wafers were subsequently diced from each region to be examined by X-ray diffraction and RBS analysis. X-ray diffraction, results which are shown in FIG. 6, indicate that $CoSi_2$ has formed in the central areas and CoSi just outside this area. On the periphery of the wafer, the partially reacted region shows a broad Co peak, indicating the beginning of the interaction with Si. As expected, RBS analysis taken from different areas also show a greater content of Co reaction in the center regions, as described below.

Figure 7:
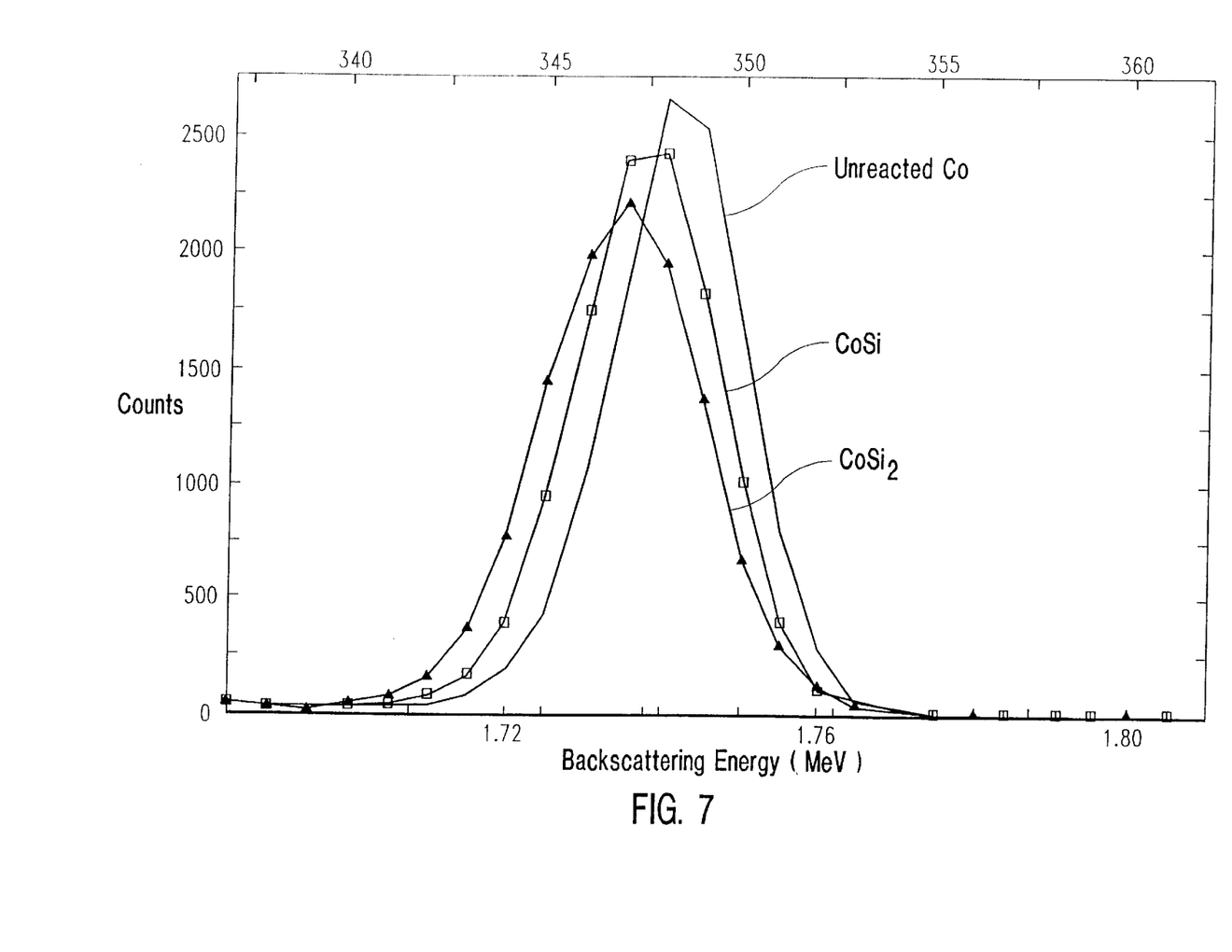
FIG. 7 is a RBS of the wafer of FIG. 6, showing the Co peaks from samples taken in different parts of the wafer corresponding to unreacted Co, CoSi, and $CoSi_2$.

In FIG. 7, the RBS Co peak becomes shorter and broader going from the unreactive portion of the wafer to the CoSi region, then to the $CoSi_2$ region, corresponding to the increase in thickness and decrease in Co concentration within the layers as the silicide reaction proceeds from a thin pure Co metal (100%) layer to a thicker $CoSi_2$ layer (33% Co).

After microwave annealing and analysis, selected wafers were subject to etching in a solution of 10:1 $H_2O_2:H_2SO_4$ at 65° C. to remove unreactive material from the top of the silicide surface. Monitoring the removal of Co can serve as an indicator of the extent of reaction because well formed CoSi and $CoSi_2$ are unetchable in the above solution, whereas Co metal and Co-rich silicides etch readily. By subjecting samples to RBS after etching, the amount of Co-containing material can be measured to an accuracy of a few %.

Figure 8:
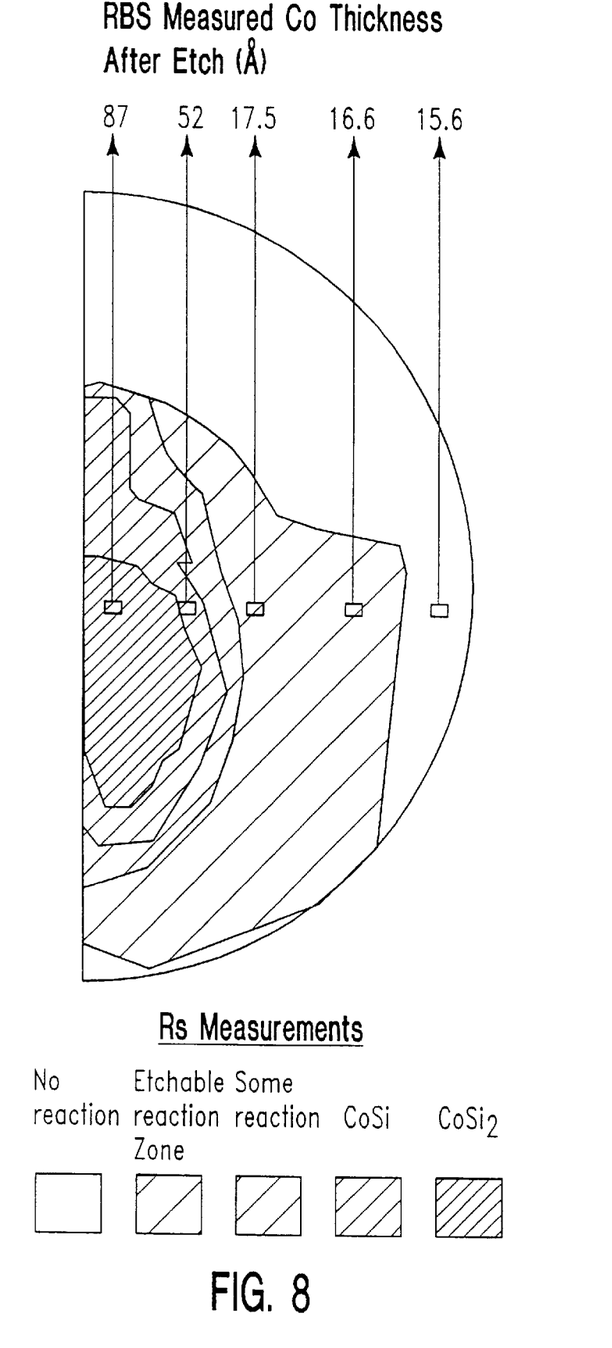
FIG. 8 shows the RBS results taken from part of the wafer that contain predominately $CoSi_2$, CoSi and unreacted metal by giving the amount of residual equivalent thickness of cobalt remaining after etching.

FIG. 8 shows the results taken from parts of a wafer that were deemed to contain predominately $CoSi_2$, CoSi and unreactive metal. The nominal starting thickness of 80 Å Co is still obtained in the $CoSi_2$ region after etching, as expected, indicating no unreacted Co material in that region, whereas in the CoSi region bordering the $CoSi_2$ region, some 30 Å of Co equivalent thickness was removed, indicating that the CoSi region initially contains some Co-rich etchable surface. In the nominally unreacted region, a 15 Å residual Co-equivalent layer remains, indicating some interface alloying of Co with the Si even at presumably quite low temperatures. Additionally, the behavior for uncoated Co films also occurs in the TiN-coated regions of the wafer. The fact that the pattern of formation appears acentric is probably due to beam placement and does not indicate as such any attenuation of the annealing process by the TiN layer. In fact, at 100 mS, the $CoSi_2$ region is symmetrically distributed across the boundary between uncoated and TiN coated wafers. Thus, all the XRD, RBS and Rs measurements show the Co silicide forms in a similar manner in the microwave annealing compared to conventional RTA.

In one sample subjected to 100 mS 270 KW irradiation, a small region in the wafer center reached sufficiently high temperature to cause the silicon wafer to melt locally over a few $mm^2$ area. This region had essentially infinite electrical resistance, showing a rough surface where the silicon had melted and recrystallized, at least tens of microns into the wafer, redistributing surface conductive silicide and leaving residual undoped Si on the wafer surface. In regions immediately surrounding the melted area, the Rs remained very low, around 10 Ohm/Sq. This suggests that in the region bordering the melting zone the silicide layer had not begun to agglomerate, which would cause the Rs to increase by orders of magnitude. These results were unexpected, inasmuch as the region immediately surrounding the melted area probably approached the Si melting temperature of 1400° C., well above the 850° C. temperature where agglomeration becomes evident for $CoSi_2$ subject to conventional RTA. Thus, the short pulse microwave heating is able to effectively anneal $CoSi_2$ to relatively high temperature without destroying the film continuity right up to the edge of the melting zone. This suggests that a larger effective process window for $CoSi_2$ will be obtained in which low Rs $CoSi_2$ phase can be formed without breaking up. Inasmuch as the incipient silicide agglomeration has been linked to increased device leakage, the short pulse annealing may be key to forming low Rs, without high leakage.

Microwave annealing of samples with Co deposited on Si which was previously implanted with $4 \times 10^{15}$ boron dose and annealed at 1000° C. for 5 secs., produced silicide as readily as was found in samples using undoped Si.

Figure 9A:
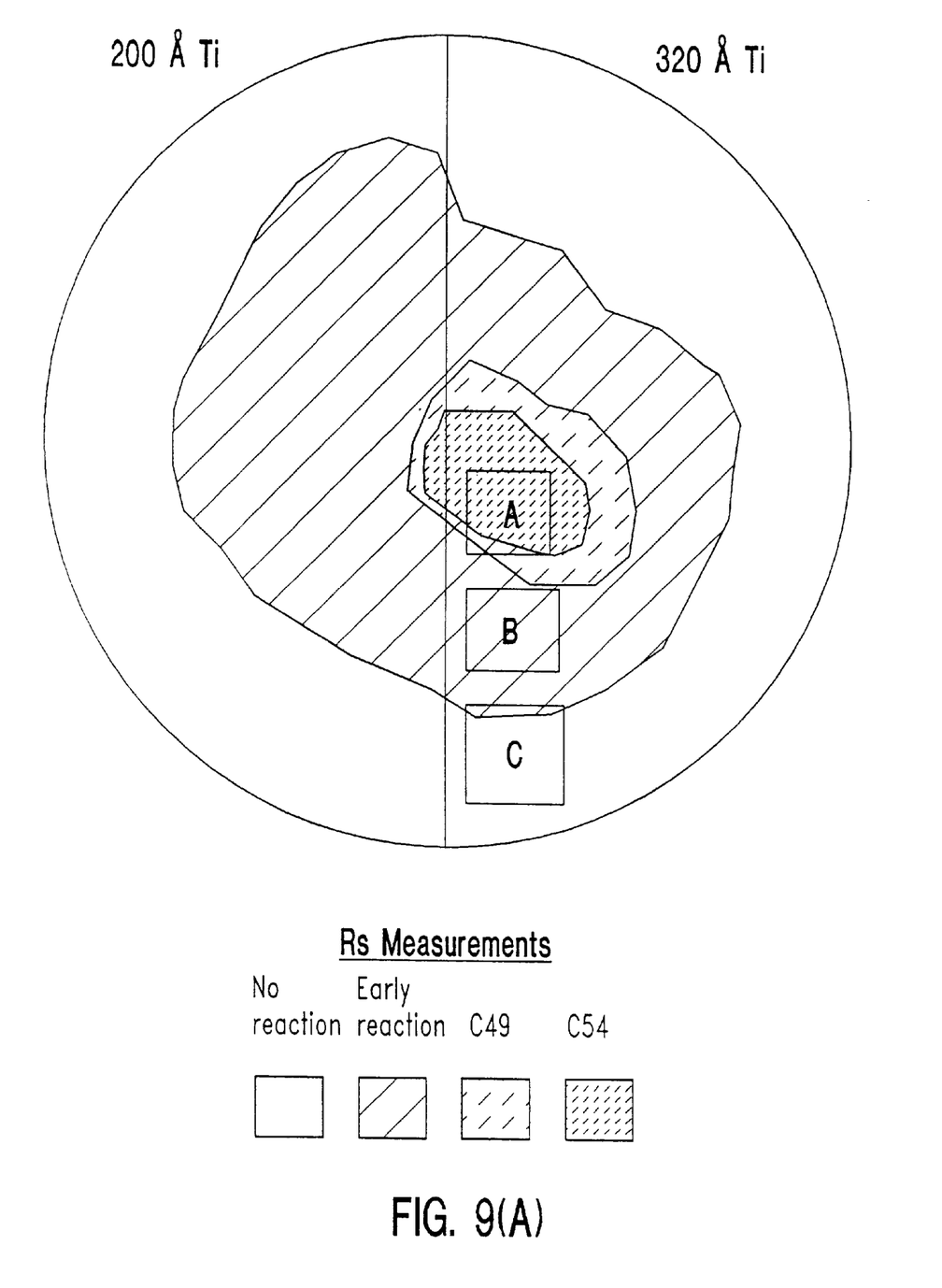
FIGS. 9(A) & (B) shows the results of 75 mS annealing of a Ti/Si (100) wafer which is divided in halves having different Ti thicknesses: (A) Rs measurement; and (B) XRD measurement.
Figure 9B:
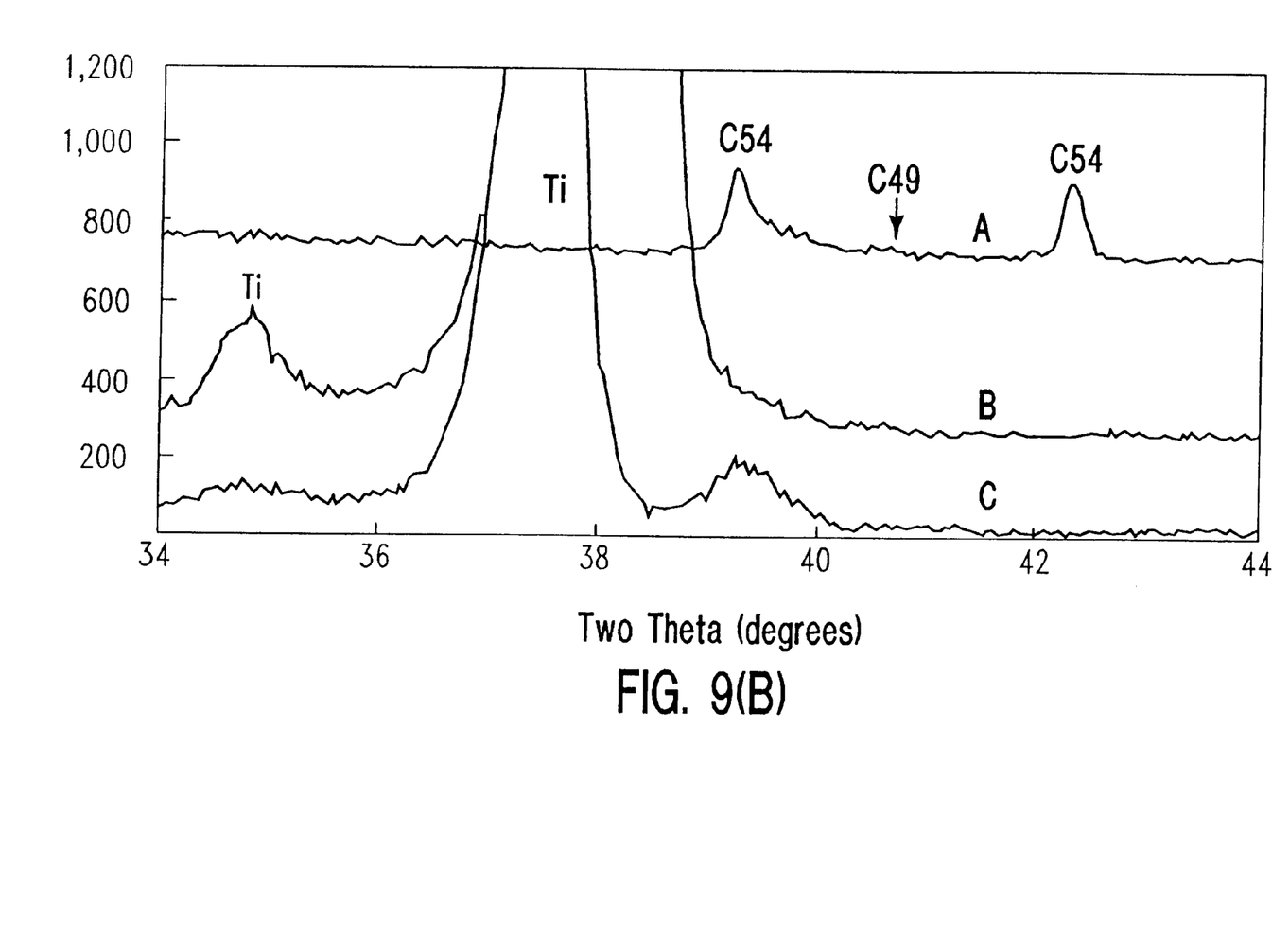

FIGS. 9(A) & (B) show the results of 75 mS annealing of Ti/Si(100) where the wafer was divided in halves having different Ti thickness. The wafer was partly reacted over about the inner 50% area, and showed the presence of $TiSi_2$ in the center region located in the same region as the $CoSi_2$ formed above. On the 320 Å Ti half of the wafer, the inner portion exhibited Rs as low as 4 Ohm/Sq. indicative of C54 $TiSi_2$ phase. The respective values are about double on the 200 Å Ti half, because of thinner silicide. Surrounding the C54 region it has Rs of about 15–20 Ohm/Sq. indicative of C49 $TiSi_2$ phase. This is confirmed by XRD. The silicidation reaction has taken place both in the area of thick and thin Ti.

The above example illustrates that pulsed microwave radiation in the time regime of from about 35 to about 100 mS can be successfully used to form metal silicide when incident on a thin metal deposited on Si. This can be accomplished over a range of metal thickness and type, in combination with TiN capping layers, and in the presence of a high concentration of dopants in the Si substrate. The silicide formed is stable to high temperatures for short durations during microwave heating.

While the invention has been particularly shown and described with respect to the preferred embodiments thereof, it will be understood by those skilled in the art that the foregoing and other changes in form and detail may be made without departing from the spirit and scope of the present invention.

Having thus described our invention, what we claim as new, and desire to secure by Letters Patent is:

1. A method of forming a silicide layer or region near the interface region of two dissimilar materials comprising the steps of:

(a) providing a structure having at least two dissimilar materials intimately in contact with each other so that an interface region exists therebetween, wherein at least one of said dissimilar materials is capable of being heated by microwave radiation and at least one of said dissimilar materials contains silicon; and (b) irradiating the structure with microwave energy under conditions effective to form a silicide layer or region without causing substantial agglomeration thereof, said silicide layer or region being formed in proximity to said interface region of said structure.

2. The method of claim 1 wherein one of said dissimilar materials is composed of a silicon-containing material; a transition metal, a non-transition metal, alloys of transition metals, alloys of non-transition metals, alloys of transition and non-transition metals, polymers, insulators, monomers, ceramic oxides, nitrides or carbides, or doped or undoped glass.

3. The method of claim 2 wherein said dissimilar material is composed of a transition metal selected from Group IVB, VB, VIB, VIII and IB of the Periodic Table of Elements.

4. The method of claim 3 wherein said transition metal is selected from the group consisting of titanium, tantalum, tungsten, cobalt, palladium, nickel, zirconium, platinum, niobium, iridium, vanadium and yttrium.

5. The method of claim 4 wherein said transition metal is composed of cobalt, titanium, platinum, nickel or alloys comprising at least one of cobalt, titanium, platinum or nickel.

6. The method of claim 2 wherein said other dissimilar material is different from the first dissimilar material and is composed of a silicon-containing material; doped or undoped glass; transition metals, non-transition metals, alloys of transition and/or non-transition metals; polymers; monomers; or ceramic oxides, nitrides or carbides.

7. The method of claim 6 wherein said silicon-containing material is composed silicon, SiGe, SiC, SiGeC.

8. The method of claim 7 wherein said silicon-containing material is composed of silicon.

9. The method of claim 7 wherein said silicon-containing material is doped with an appropriate dopant.

10. The method of claim 1 wherein said dissimilar materials are brought into intimate contact by chemical vapor deposition, physical vapor deposition, plasma deposition, electro- or electroless plating or spin-coating.

11. The method of claim 1 wherein said at least two dissimilar materials are chemically bonded or physically bonded.

12. The method of claim 1 wherein said silicide layer is a composed of a metal silicide.

13. The method of claim 12 wherein said metal silicide is titanium silicide or cobalt silicide.

14. The method of claim 1 wherein said irradiating is carried out using microwave radiation having a frequency of from about 300 megahertz to about 400 gigahertz, a pulse duration of from about 0.02 to about 20 seconds, and a power density of at least about 100 watts/cm$^2$.

15. The method of claim 14 wherein said irradiating is carried out using a microwave radiation having a frequency of from about 80 to about 120 gigahertz, a pulse duration of from about 0.02 to about 0.15 seconds, and a power density of from about 500 to about 20,000 watts/cm$^2$.

16. A method of forming a silicide layer or region near the interface region of two dissimilar materials comprising the steps of:

(a) providing a structure having at least two dissimilar materials intimately in contact with each other so that an interface region exists therebetween and a third layer, wherein at least one of said dissimilar materials or said third layer is capable of being heated by microwave radiation and at least one of said dissimilar materials contains silicon; and (b) irradiating the structure with microwave energy under conditions effective to form a silicide layer or region without causing substantial agglomeration thereof, wherein said silicide layer or region is formed in proximity to said interface region of said structure.

17. The method of claim 16 wherein said third layer is a microwave absorbing layer.

18. The method of claim 17 wherein microwave absorbing layer is composed of metallic materials, carbon-filled glasses, ceramics or polymers, doped glass, doped $SiO_2$ or amorphous silica.

19. The method of claim 16 wherein said third layer is patterned prior to conducting step (b).

20. The method of claim 1 wherein one of said dissimilar materials is composed of titanium and the other dissimilar material is composed of silicon.

21. The method of claim 1 wherein one of said dissimilar materials is composed of cobalt and the other dissimilar material is composed of silicon.

22. The method of claim 20 or 21 further comprising a microwave absorbing layer.

23. A method for forming a metal silicide layer or region near the interface of a transition metal layer and a silicon-containing material, said method comprising the steps of:

(a) forming a metal layer on a surface of a silicon-containing material, wherein an interface exists between said metal layer and said silicon-containing material; and (b) irradiating the structure of (a) with microwave radiation under conditions effective to cause the formation of a metal silicide layer at said interface without causing substantial agglomeration of said metal silicide layer.

* * * * *